(12) United States Patent
Rathburn

(10) Patent No.: US 8,912,812 B2
(45) Date of Patent: *Dec. 16, 2014

(54) COMPLIANT PRINTED CIRCUIT WAFER PROBE DIAGNOSTIC TOOL

(75) Inventor: James Rathburn, Mound, MN (US)

(73) Assignee: Hsio Technologies, LLC, Maple Grove, MN (US)

( * ) Notice: Subject to any disclaimer, the term of this patent is extended or adjusted under 35 U.S.C. 154(b) by 253 days.

This patent is subject to a terminal disclaimer.

(21) Appl. No.: 13/318,038

(22) PCT Filed: May 27, 2010

(86) PCT No.: PCT/US2010/036388
§ 371 (c)(1),
(2), (4) Date: Oct. 28, 2011

(87) PCT Pub. No.: WO2010/141316
PCT Pub. Date: Dec. 9, 2010

(65) Prior Publication Data
US 2012/0062270 A1   Mar. 15, 2012

Related U.S. Application Data

(60) Provisional application No. 61/183,388, filed on Jun. 2, 2009.

(51) Int. Cl.
*G01R 31/00* (2006.01)
*G01R 31/28* (2006.01)
*G01R 31/02* (2006.01)

(52) U.S. Cl.
CPC .......... *G01R 31/2889* (2013.01); *G01R 31/024* (2013.01)
USPC ............. 324/756.03; 324/762.02; 324/763.01

(58) Field of Classification Search
USPC ............. 324/756.01–756.07, 763.01–763.02, 324/762.01–762.09, 754.03–754.2
See application file for complete search history.

(56) References Cited

U.S. PATENT DOCUMENTS

| 3,672,986 A | 6/1972 | Schneble, Jr. et al. |
| 4,188,438 A | 2/1980 | Burns |

(Continued)

FOREIGN PATENT DOCUMENTS

| JP | 2003/217774 | 7/2003 |
| WO | WO 91/14015 | 9/1991 |

(Continued)

OTHER PUBLICATIONS

Notification of Transmittal of the International Search Report and the Written Opinion of the International Searching Authority mailed Apr. 5, 2012 in International Application No. PCT/US2011/062321.

(Continued)

*Primary Examiner* — Huy Q Phan
*Assistant Examiner* — Dustin Dickinson
(74) *Attorney, Agent, or Firm* — Stoel Rives LLP

(57) ABSTRACT

Diagnostic tools for testing wafer-level IC devices, and a method of making the same. The first diagnostic tool can include a first compliant printed circuit with a plurality of contact pads configured to form an electrical interconnect at a first interface between distal ends of probe members in the wafer probe and contact pads on a wafer-level IC device. A plurality of printed conductive traces electrically couple to a plurality of the contact pads on the first compliant printed circuit. A plurality of electrical devices are printed on the first compliant printed circuit at a location away from the first interface. The electrical devices are electrically coupled to the conductive traces and are configured to provide one or more of continuity testing or functionality of the wafer-level IC devices. A second diagnostic tool includes a second compliant printed circuit electrically coupled to a dedicated IC testing device. A plurality of electrical devices are printed on the second compliant printed circuit and electrically coupled to the dedicated IC device.

21 Claims, 7 Drawing Sheets

(56) References Cited

U.S. PATENT DOCUMENTS

| | | |
|---|---|---|
| 4,489,999 A | 12/1984 | Miniet |
| 4,922,376 A | 5/1990 | Pommer et al. |
| 4,964,948 A | 10/1990 | Reed |
| 5,014,159 A | 5/1991 | Butt |
| 5,072,520 A | 12/1991 | Nelson |
| 5,127,837 A | 7/1992 | Shah et al. |
| 5,129,573 A | 7/1992 | Duffey |
| 5,161,983 A | 11/1992 | Ohno |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,562,462 A | 10/1996 | Matsuba et al. |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,791,911 A | 8/1998 | Fasano et al. |
| 5,802,711 A | 9/1998 | Card et al. |
| 5,819,579 A | 10/1998 | Roberts |
| 5,904,546 A | 5/1999 | Wood et al. |
| 5,913,109 A | 6/1999 | Distefano et al. |
| 5,925,931 A | 7/1999 | Yamamoto |
| 5,933,558 A | 8/1999 | Sauvageau et al. |
| 6,020,597 A | 2/2000 | Kwak |
| 6,062,879 A | 5/2000 | Beaman et al. |
| 6,080,932 A | 6/2000 | Smith et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,437,452 B2 | 8/2002 | Lin |
| 6,459,418 B1 | 10/2002 | Comiskey |
| 6,461,183 B1 | 10/2002 | Ohkita |
| 6,462,418 B2 | 10/2002 | Sakamoto et al. |
| 6,477,286 B1 | 11/2002 | Ouchi |
| 6,506,438 B2 | 1/2003 | Duthaler et al. |
| 6,521,489 B2 | 2/2003 | Duthaler |
| 6,545,291 B1 | 4/2003 | Amundson |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,750,551 B1 | 6/2004 | Frutschy et al. |
| 6,758,691 B1 | 7/2004 | McHugh |
| 6,773,302 B2 | 8/2004 | Gutierrez et al. |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,064,412 B2 | 6/2006 | Geissinger et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 * | 2/2007 | Bucksch .................. 324/754.18 |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,244,967 B2 | 7/2007 | Hundt et al. |
| 7,249,954 B2 | 7/2007 | Weiss |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,422,439 B2 | 9/2008 | Rathburn et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,508,076 B2 | 3/2009 | Japp et al. |
| 7,527,502 B2 | 5/2009 | Li |
| 7,537,461 B2 | 5/2009 | Rathburn |
| 7,538,415 B1 | 5/2009 | Lin et al. |
| 7,548,430 B1 | 6/2009 | Huemoeller et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,632,106 B2 | 12/2009 | Nakamura |
| 7,651,382 B2 | 1/2010 | Yasumura et al. |

(56) References Cited

U.S. PATENT DOCUMENTS

| | | |
|---|---|---|
| 7,658,163 B2 | 2/2010 | Renn |
| 7,674,671 B2 | 3/2010 | Renn |
| 7,726,984 B2 | 6/2010 | Bumb et al. |
| 7,748,110 B2 | 7/2010 | Asahi et al. |
| 7,800,916 B2 | 9/2010 | Blackwell et al. |
| 7,833,832 B2 | 11/2010 | Wood et al. |
| 7,897,503 B2 | 3/2011 | Foster et al. |
| 7,898,087 B2 | 3/2011 | Chainer |
| 7,999,369 B2 | 8/2011 | Malhan et al. |
| 8,072,058 B2 | 12/2011 | Kim et al. |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,227,703 B2 | 7/2012 | Maruyama et al. |
| 8,232,632 B2 | 7/2012 | Rathburn |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,346 B2 | 9/2013 | Rathburn |
| 8,536,714 B2 | 9/2013 | Sakaguchi |
| 8,610,265 B2 | 12/2013 | Rathburn |
| 8,618,649 B2 | 12/2013 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 2001/0012707 A1 | 8/2001 | Ho et al. |
| 2001/0016551 A1 | 8/2001 | Yushio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0188890 A1 | 10/2003 | Bhatt et al. |
| 2003/0189083 A1 | 10/2003 | Olsen |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0164527 A1 | 7/2005 | Radza et al. |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0087064 A1 | 4/2006 | Daniel et al. |
| 2006/0149491 A1* | 7/2006 | Flach et al. ............ 702/107 |
| 2006/0157103 A1 | 7/2006 | Sheats et al. |
| 2006/0160379 A1 | 7/2006 | Rathburn |
| 2006/0186906 A1* | 8/2006 | Bottoms et al. ............ 324/754 |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2007/0021002 A1 | 1/2007 | Laurx et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1* | 8/2007 | Komatsu et al. ............ 324/754 |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0269999 A1 | 11/2007 | Di Stefano |
| 2007/0273394 A1 | 11/2007 | Tanner et al. |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0143358 A1 | 6/2008 | Breinlinger |
| 2008/0143367 A1 | 6/2008 | Chabineau-Lovgren |
| 2008/0157361 A1 | 7/2008 | Wood et al. |
| 2008/0182436 A1 | 7/2008 | Rathburn |
| 2008/0185180 A1 | 8/2008 | Cheng et al. |
| 2008/0197867 A1* | 8/2008 | Wokhlu et al. ............ 324/755 |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0246136 A1 | 2/2009 | Beer et al. |
| 2009/0058444 A1 | 3/2009 | McIntyre |
| 2009/0061089 A1 | 3/2009 | King |
| 2009/0065918 A1 | 3/2009 | Murphy |
| 2009/0127698 A1 | 5/2009 | Rathburn |
| 2009/0133906 A1 | 5/2009 | Baek |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0022105 A1 | 1/2010 | Di Stefano |
| 2010/0133680 A1 | 6/2010 | Kang et al. |
| 2010/0213960 A1 | 8/2010 | Mok et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0105984 A1 | 5/2013 | Rathburn |

(56) References Cited

U.S. PATENT DOCUMENTS

| | | |
|---|---|---|
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |

FOREIGN PATENT DOCUMENTS

| | | |
|---|---|---|
| WO | WO 2006/039277 | 4/2006 |
| WO | WO 2006/124597 | 11/2006 |
| WO | 2008/0156856 | 12/2008 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO-2014/011226 | 1/2014 |
| WO | WO-2014/011228 | 1/2014 |
| WO | WO-2014/011232 | 1/2014 |

OTHER PUBLICATIONS

Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.

(56) References Cited

OTHER PUBLICATIONS

Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US20101/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2011/023138.
Notification of Transmittal of the International Search Report and the Written Opinion of the International Searching Authority issued Aug. 17, 2011 in International Application No. PCT/US2011/033726.
Notification of Transmittal of the International Search Report and the Written Opinion of the International Searching Aurhority issued Sep. 27, 2011 in International Application No. PCT/US2011/038845.
Co-pending U.S. Appl. No. 13/266,486 titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Tester Interface, filed Nov. 7, 2011.
Co-pending U.S. Appl. No. 13/319,228, titled Singulated Semiconductor Device Separable Electrical Interconnect, filed Nov. 7, 2011.
Print—Definition of Print by the Free Dictionary, http://www.thefreedictionary.com/print, Aug. 13, 2014.
Amendment and Response Under Rule 1.116 filed Jul. 10, 2014 in co-pending U.S. Appl. No. 13/266,486, now published as US Patent Application Publication No. US 2012/0055701.
Advisory Action mailed Jul. 21, 2014 in co-pending U.S. Appl. No. 13/266,486, now published as US Patent Application Publication No. US 2012/0055701.
Request for Continued Examination filed Jul. 31, 2014 in co-pending U.S. Appl. No. 13/266,486, now published as US Patent Application Publication No. US 2012/0055701.
Office Action mailed Jul. 3, 2014 in co-pending U.S. Appl. No. 13/266,573, now published as US Patent Application Publication No. 2012/0061846.
Amendment and Response Under Rule 1.116 mailed Jul. 10, 2014 in co-pending U.S. Appl. No. 13/266,907, now published as US Patent Application Publication No. US 2012/0268155.
Advisory Action mailed Jul. 25, 2014 in co-pending U.S. Appl. No. 13/266,907, now published as US Patent Application Publication No. US 2012/0268155.
Advisory Action mailed Aug. 8, 2014 in co-pending U.S. Appl. No. 13/266,907, now published as US Patent Application Publication No. US 2012/0268155.
Amendment and Response to Final Office Action and RCE filed Aug. 26, 2014 in co-pending U.S. Appl. No. 13/266,907, now published as US Patent Application Publication No. US 2012/0268155.
Amendment and Response filed Jul. 27, 2014 in co-pending U.S. Appl. No. 13/318,181, now published as US Patent Application Publication No. US 2012/0044659.
Office Action mailed Jul. 29, 2014 in co-pending U.S. Appl. No. 13/320,285, now published as US Patent Application Publication No. US 2012/0055702.
Final Office Action mailed Jul. 31, 2014 in co-pending U.S. Appl. No. 13/320,285, now published as US Patent Application Publication No. US 2012/0055702.
Office Action mailed Aug. 26, 2014 in co-pending U.S. Appl. No. 13/318,382, now published as US Patent Application Publication No. US 2012/0043130.
Final Office Action mailed Aug. 4, 2014 in co-pending U.S. Appl. No. 13/319,145, now published as US Patent Application Publication No. 2012/0049342.
Amendment and Response filed Sep. 3, 2014 in co-pending U.S. Appl. No. 13/319,158, now published as US Patent Application Publication No. 2012/0051016.
Final Office Action mailed Aug. 20, 2014 in co-pending U.S. Appl. No. 13/319,203, now published as US Patent Application Publication No. 2012/0056640.
Office Action mailed Sep. 4, 2014 in co-pending U.S. Appl. No. 13/319,228, now published as US Patent Application Publication No. US 2012/0058653.
Amendment and Response filed Jul. 30, 2014 in co-pending U.S. Appl. No. 13/700,639, now published as US Patent Application Publication No. 2013/0078860.
Response to Restriction Requirement filed Jul. 17, 2014 in co-pending U.S. Appl. No. 13/879,783, now published as US Patent Application Publication No. 2013/0223034.
Amendment and Response Under Rule 1.116 filed Jul. 29, 2014 in co-pending U.S. Appl. No. 13/410,914, now published as US Patent Application Publication No. US 2012/0164888.
Advisory Action mailed Aug. 12, 2014 in co-pending U.S. Appl. No. 13/410,914, now published as US Patent Application Publication No. US 2012/0164888.
Restriction Requirement mailed Jul. 31, 2014 in co-pending U.S. Appl. No. 13/410,943, now published as US Patent Application Publication No. US 2012/0161317.
Response to Restriction Requirement filed Aug. 19, 2014 in co-pending U.S. Appl. No. 13/410,943, now published as US Patent Application Publication No. US 2012/0161317.
Amendment and Response filed Aug. 26, 2014 in co-pending U.S. Appl. No. 13/418,853, now published as US Patent Application Publication No. US 2012/0244728.
Co-pending U.S. Appl. No. 14/327,916 titled Matrix Defined Electrical Circuit Structure, filed Jul. 10, 2014.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.

(56) References Cited

OTHER PUBLICATIONS

Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.
Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Final Office Action mailed May 15, 2014 in co-pending U.S. Appl. No. 13/266,486, now published as US Patent Application Publication No. US 2012/0055701.

Notice of Allowance and Fee(s) Due mailed May 2, 2014 in co-pending U.S. Appl. No. 13/266,522, now published as US Patent Application Publication No. 2012/0068727.
Final Office Action mailed May 7, 2014 in co-pending U.S. Appl. No. 13/266,907, now published as US Patent Application Publication No. US 2012/0268155.
Amendment and Response filed Mar. 18, 2014 in co-pending U.S. Appl. No. 13/319,145, now published as US Patent Application Publication No. 2012/0049342.
Office Action mailed Jun. 27, 2014 in co-pending U.S. Appl. No. 13/319,158, now published as US Patent Application Publication No. 2012/0051016.
Amendment and Response file Jun. 10, 2014 in co-pending U.S. Appl. No. 13/319,203, now published as US Patent Application Publication No. 2012/0056640.
Response to Restriction Requirement filed Jun. 23, 2014 in co-pending U.S. Appl. No. 13/319,228, now published as US Patent Application Publication No. US 2012/0058653.
Restriction Requirement mailed Jun. 5, 2014 in co-pending U.S. Appl. No. 13/879,783, now published as US Patent Application Publication No. 2013/0223034.
Final Office Action mailed Jun. 4, 2014 in co-pending U.S. Appl. No. 13/410,914, now published as US Patent Application Publication No. US 2012/0164888.
Notice of Allowance and Fee(s) Due mailed May 9, 2014 in co-pending U.S. Appl. No. 13/413,724, now published as US Patent Application Publication No. US 2012/0168948.
Response to Restriction Requirement filed Apr. 23, 2014 in co-pending U.S. Appl. No. 13/418,853, now published as US Patent Application Publication No. US 2012/0244728.
Office Action mailed Jun. 26, 2014 in co-pending U.S. Appl. No. 13/418,853, now published as US Patent Application Publication No. US 2012/0244728.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Feb. 14, 2014 in co-pending U.S. Appl. No. 13/318,171, now published as US Patent Application Publication No. US 2012/0049877.
Amendment and Response filed Feb. 26, 2014 in co-pending U.S. Appl. No. 13/318,171, now published as US Patent Application Publication No. US 2012/0049877.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.

(56) References Cited

OTHER PUBLICATIONS

Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/309,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 2012/0171907.
Final Office Action mailed Feb. 14, 2014 in co-pending U.S. Appl. No. 13/413,724, now published as US Patent Application Publication No. US 2012/0168948.
Amendment and Response to Final Office filed Feb. 26, 2014 in co-pending U.S. Appl. No. 13/413,724, now published as US Patent Application Publication No. US 2012/0168948.
Amendment and Response to Final Office filed Dec. 30, 2013 in co-pending U.S. Appl. No. 13/969,953, now published as US Patent Application Publication No. US 2013/0330942.
Notice of Allowance and Fee(s) Due mailed Jan. 22, 2014 in co-pending U.S. Appl. No. 13/969,953, now published as US Patent Application Publication No. US 2013/0330942.
Co-pending U.S. Appl. No. 14/238,638 titled Direct Metalization of Electrical Circuit Structure, filed Feb. 12, 2014.
Co-pending U.S. Appl. No. 13/575,368, titled High Speed Backplane Connector, filed Jul. 26, 2012.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-to-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Notice of Allowance and Fee(s) Due mailed Mar. 14, 2014 in co-pending U.S. Appl. No. 13/318,171, now published as US Patent Application Publication No. US 2012/0049877.
Office Action mailed Apr. 21, 2014 in co-pending U.S. Appl. No. 13/318,181, now published as US Patent Application Publication No. US 2012/0044659.
RCE filed Mar. 10, 2014 in co-pending U.S. Appl. No. 13/320,285, now published as US Patent Application Publication No. US 2012/0055702.
Amendment and Response filed Apr. 16, 2014 in co-pending U.S. Appl. No. 13/319,120 now published as US Patent Application Publication No. US 2012/0061851.
Restriction Requirement mailed Apr. 23, 2014 in co-pending U.S. Appl. No. 13/319,228, now published as US Patent Application Publication No. US 2012/0058653.
Office Action mailed Apr. 24, 2014 in co-pending U.S. Appl. No. 13/700,639, now published as US Patent Application Publication No. 2013/0078860.
Amendment and Response filed Mar. 17, 2014 in co-pending U.S. Appl. No. 13/410,914, now published as US Patent Application Publication No. US 2012/0164888.
Advisory Action mailed Mar. 28, 2014 in co-pending U.S. Appl. No. 13/413,724, now published as US Patent Application Publication No. US 2012/0168948.
Second Amendment and Response filed Apr. 14, 2014 in co-pending U.S. Appl. No. 13/413,724, now published as US Patent Application Publication No. US 2012/0168948.
Restriction Requirement mailed Apr. 10, 2014 in co-pending U.S. Appl. No. 13/418,853, now published as US Patent Application Publication No. US 2012/0244728.
Office Action mailed Mar. 20, 2014 in co-pending U.S. Appl. No. 14/058,863, now published as US Patent Application Publication No. 2014/0043782.
Office Action mailed Mar. 27, 2014 in co-pending U.S. Appl. No. 14/058,863, now published as US Patent Application Publication No. 2014/0043782.
Response and Terminal Disclaimer filed Apr. 2, 2014 in co-pending U.S. Appl. No. 14/058,863, now published as US Patent Application Publication No. 2014/0043782.
Notice of Allowance and Fee(s) Due mailed Apr. 17, 2014 in co-pending U.S. Appl. No. 14/058,863, now published as US Patent Application Publication No. 2014/0043782.
Co-pending U.S. Appl. No. 14/254,038 titled High Performance Electrical Connector With Translated Insulator Contact Positioning, filed Apr. 16, 2014.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Response to Restriction Requirement filed Jul. 15, 2013 in co-pending U.S. Appl. No. 13/266,486, now published as US Patent Application Publication No. US 2012/0055701.
Restriction Requirement mailed Sep. 25, 2013 in co-pending U.S. Appl. No. 13/266,486, now published as US Patent Application Publication No. US 2012/0055701.
Response to Restriction Requirement filed Oct. 2, 2013 in co-pending U.S. Appl. No. 13/286,486, now published as US Patent Application Publication No. US 2012/0055701.
Office Action mailed Jul. 10, 2013 in co-pending U.S. Appl. No. 13/318,263, now published as US Patent Application Publication No. US 2012/0043667.

(56) References Cited

OTHER PUBLICATIONS

Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.
Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.

* cited by examiner

COMPLIANT PRINTED CIRCUIT WAFER PROBE DIAGNOSTIC TOOL

CROSS-REFERENCE TO RELATED APPLICATIONS

This application is a national stage application under 35 U.S.C. §371 of International Application No. PCT/US2010/036388, titled COMPLIANT PRINTED CIRCUIT WAFER PROBE DIAGNOSTIC TOOL, filed May 27, 2010, which claims priority to U.S. Provisional Application No. 61/183,388, filed Jun. 2, 2009, both of which are hereby incorporated by reference in their entireties.

FIELD OF THE INVENTION

The present disclosure relates to a compliant printed circuit that forms the basis of a diagnostic tool for testing wafer-level integrated circuit (IC) devices.

BACKGROUND OF THE INVENTION

There are many applications where a wafer probe is used to connect an IC device to a printed circuit board (PCB) so that the electrical connection is made in a separable manner. As illustrated in FIG. 1, a wafer probe 20 in a test system 22 may have a plurality of probe members 24 that connect terminals 26 (or contact pads) on an IC device 28 to corresponding terminals 30 (or contact pads) on a PCB 32. The probe members 24 are held against the terminals 26 on the IC device 28 by applying a load 34 (or force) that maintains intimate contact and reliable connection during testing. No permanent connection is required such that the IC device 28 can be removed or replaced without a need to reflow solder connections.

The probe members 24 in the wafer probe 20 have at least two interface points for every probe member 24, a first interface 36 with the IC device 28 and a second interface 38 with the PCB 32. When the wafer probe is used 20 to connect to the IC device 28, there may be an assumption that the connection point for each terminal 26 is reliable. In the event the system is powered and the function of the IC device 28 is not as expected, any one of many connection points at the interfaces 36, 38 may be a cause of an error.

If the IC device 28 is removed and replaced and the issue is resolved, then a conclusion can be drawn that all of the other components in the test system 22 are connected and functioning properly. In the event the error is not resolved or another issue is introduced, the user must systematically sort through the various components and connections within the test system 22 to resolve the issue. In many cases, the wafer probe 20 may be a source of error due to the number of connections at the interfaces 36, 38 and the potential for at least one of those connections to be improperly positioned. A typical method to identify and resolve a wafer probe connection error is to replace the wafer probe 20 with another new wafer probe, or place the wafer probe 20 on an interface known to function properly to attempt to determine if the wafer probe 20 is the source of the error. If the new wafer probe functions properly, then the initial wafer probe 20 can be deemed the source of the error. If the new wafer probe does function properly, then the issue is not resolved because the issue may be common or related to how the wafer probe 20 interfaces to the IC device 28 or to the PCB 32. This systematic troubleshooting process can be extremely time consuming and can cause major delays, and can impact the ability to continue testing IC devices.

There are several limitations to traditional methods of identifying and resolving wafer probe connection problems. The common method of replacing the wafer probe 20 with another is typically the first avenue, and requires that additional wafer probes 20 are available. Also, a successful result depends entirely on whether the issue is isolated to the initial wafer probe 20. This method can identify if there is an anomaly with the initial wafer probe 20 such as a damaged contact or poor connection. In the event the new wafer probe 20 does not produce desired results, further investigation is required. There may be a problem that is common to the wafer probes generally, and additional investigation is needed to determine if the source of the error remains with the wafer probe 20 or if the issue is elsewhere.

Another method of identifying and resolving wafer probe 20 connection errors may involve creating an external validation vehicle such as a PCB that mimics the system board. This method can be more determinant than an "in the system" approach such as replacing the wafer probe. The wafer probe interfaces 36, 38 can be isolated and if there is an issue with the group of contacts or with specific contacts the issue can be readily identified. A limitation of this method, however, can include that it requires that these external tools be created ahead of time so they are available if and when they are needed, which would result in additional effort and expense that is wasted if the wafer probe performs as expected.

Establishing these tools ahead of time can provide confidence that the wafer probe is functioning properly and, in the end, reduce effort because the user can trust that the wafer probe is working. However, there is some risk that the external tools may not match the actual system circuit board precisely in form and/or function, and that issues that are not present on the external tools may be present on the system PCB. Another limitation is that it can be difficult to mimic the terminal pattern of the IC device being tested due to the fine feature size and pitch. Still another limitation with this method may be the adverse consequences of failing to produce these external tools ahead of time, since the lead time to design and produce these tools can be long. Still another limitation is that an external circuit board or test system may not precisely match the make-up of the actual system, and/or utilize an exact IC device. Typically, a surrogate IC device is used to simulate the actual IC device and a surrogate PCB is used to simulate the system PCB. The surrogate IC device and surrogate PCB may manifest issues different from or not present in the actual IC device and surrogate PCB. Similarly, the surrogates may not manifest issues present in the actual IC device and PCB. Accordingly, problems may go undetected.

In the event these methods do not identify the problem, the actual IC device can be soldered to the site intended for the wafer probe so that the wafer probe can be eliminated from the equation. However, this method defeats the advantages of using a water probe, including eliminating the desired separability.

BRIEF SUMMARY OF THE INVENTION

The present application relates to a compliant printed circuit that forms the basis of a diagnostic tool for testing wafer-level IC devices. The compliant printed circuit can operate as an electrical interconnect between a wafer probe and wafer-level IC devices. A variety of passive and active electrical devices are incorporated into the present diagnostic tool to provide testing capabilities independent of, and/or supplementary to, conventional testing stations.

The present invention leverages the capabilities of printed electronics to provide a diagnostic tool that can validate wafer probe function external to the system and while the wafer probe is installed in the system. The present invention provides an electrical interconnect that will enable next generation electrical performance. Some of the embodiments include a high performance interconnect architecture on the interconnect.

Printing processes permit compliant printed circuits and electrical devices of diagnostic tools to be produced by a direct writing method based upon images, without the need for artwork, lengthy lead-times for circuit design and production, and subtractive circuit techniques. The present diagnostic tools can be simple or complex, and can be produced in minutes. The diagnostic tools can also be adapted as needed to accommodate additional diagnostic functions or tests. The additive nature of many printing processes, such as for example the inkjet printing process, can also provide an excellent avenue to directly print many electrical functions such as passive components, transistors, display function or adaptive intelligence. Revisions can be accomplished in moments by altering the image files and reprinting the diagnostic tool. By contrast, revisions to the tools formed using traditional methods, may take weeks.

A diagnostic tool according to the present disclosure can be as simple as a daisy chain to verify continuity, or as complex as functional testing directly on the compliant printed circuit. Positioning functional testing on the present diagnostic tool dramatically increases the value to the user, without the need to connect to external systems or testing analyzers. The diagnostic tools can be printed with simple low-cost or low-speed circuitry, or the circuitry can be printed with high frequency capability in the event an external measurement tool is connected.

The cost to produce a diagnostic tool in accordance with the present invention is a fraction of the cost of a conventional tool. A tool produced with conventional methods might cost $10,000 to $20,000 to design and produce, typically with a 4-6 week lead-time. A diagnostic tool according to the present disclosure can be produced in minutes for a fraction of the cost. The ability to modify the design or correct errors which would cause the $20,000 investment to be wasted, and reprint easily at little additional cost, offers tremendous improvements over conventional methods. Image libraries and design rules can be created to semi-automate the design process and dramatically reduce engineering time with tremendous flexibility to make changes substantially on the fly during the testing process.

The use of additive printing processes can permit the material set in a given layer to vary. Traditional PCB and circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The compliant printed circuit can be processed to add functions and electrical enhancements not found in traditional printed circuits. A diagnostic tool according to the present disclosure can be configured with conductive traces that reduce or redistribute the terminal pitch, without the addition of an interposer or daughter substrate. Grounding schemes, shielding, electrical devices, and power planes can be added to the present diagnostic tools, reducing the number of connections to the PCB and relieving routing constraints while increasing performance.

The resulting circuit geometry preferably has conductive traces that have substantially rectangular cross-sectional shapes, corresponding to recesses in a previously deposited layer. The use of additive printing processes permit conductive material, non-conductive material, and semi-conductive material to be deposited and positioned on a single layer.

In one embodiment, pre-formed conductive trace materials are located in the recesses. The recesses can be plated to form conductive traces with substantially rectangular cross-sectional shapes. In another embodiment, a conductive foil is pressed into at least a portion of the recesses. The conductive foil is sheared along edges of the recesses. The excess conductive foil not located in the recesses is removed and the recesses are plated to form conductive traces with substantially rectangular cross-sectional shapes.

One embodiment of the present disclosure can be directed to a diagnostic tool for wafer-level IC devices that are coupled to testing electronics by a wafer probe. A first diagnostic tool can include a first compliant printed circuit having a plurality of contact pads configured to form an electrical interconnect at a first interface between distal ends of probe members in the wafer probe and contact pads on one or more wafer-level IC devices. A plurality of printed conductive traces can electrically couple a plurality of the contact pads on the first compliant printed circuit. A plurality of electrical devices can be printed on the first compliant printed circuit at a position away from the first interface. The electrical devices can be coupled to the conductive traces and can be adapted to provide one or more of continuity testing at the first interface or functionality testing of the wafer-level IC devices.

The electrical devices printed on the first compliant printed circuit can be a capacitor, a resistor, a filter, a signal or power altering and enhancing device, a capacitive coupling feature, a memory device, an embedded integrated circuit, and a RF antennae. The first compliant printed circuit can optionally include one or more printed layers, such as for example a dielectric layer, a ground plane, or a power plane.

A second diagnostic tool can be provided with IC testing devices and configured to form an electrical interconnect with proximal ends of the probe members in the wafer probe at a second interface. The IC testing devices can be dedicated integrated circuits, printed circuit boards including or connected to testing logic, a test station, and the like. The second diagnostic tool can be programmed to provide one or more of continuity testing at the second interface, testing of the first diagnostic tool, or functional testing of the wafer-level IC device. The first and second diagnostic tools can be used separately or together.

Another embodiment is directed to a diagnostic tool that can include a dedicated IC testing device and can be configured to form an electrical interconnect at a first interface with proximal ends of probe members in a wafer probe. A first compliant printed circuit with a plurality of contact pads is electrically coupled to the contact pads on the dedicated IC testing device. A plurality of printed conductive traces can be coupled to a plurality of contact pads on the first compliant printed circuit. A plurality of electrical devices is printed on the first compliant printed circuit at a position away from the first interface. The electrical devices are coupled to the conductive traces and are programmed to provide one or more of continuity testing at the first interface, continuity testing at a second interface between distal ends of the probe members in the wafer probe and the wafer-level IC device, or functionality testing of the wafer-level IC device.

Another embodiment is directed to a method of making a first diagnostic tool for testing wafer-level IC devices coupled to testing electronics by a wafer probe. The method comprising the steps of printing a plurality of contact pads on a first compliant printed circuit. The contact pads are configured to form an electrical interconnect at a first interface between distal ends of probe members in the wafer probe and contact pads on the wafer-level IC device. A plurality of the conductive traces is electrically coupled to a plurality of the contact pads on the first compliant printed circuit. A plurality of electrical devices is printed on the first compliant printed circuit at a position away from the first interface so that the electrical devices are electrically coupled to the conductive traces. The first compliant printed circuit is positioned to form an electrical interconnect at the first interface. One or more of continuity at the first interface or functionality of one or more wafer-level IC devices is evaluated.

DETAILED DESCRIPTION OF THE INVENTION

Figure 1:
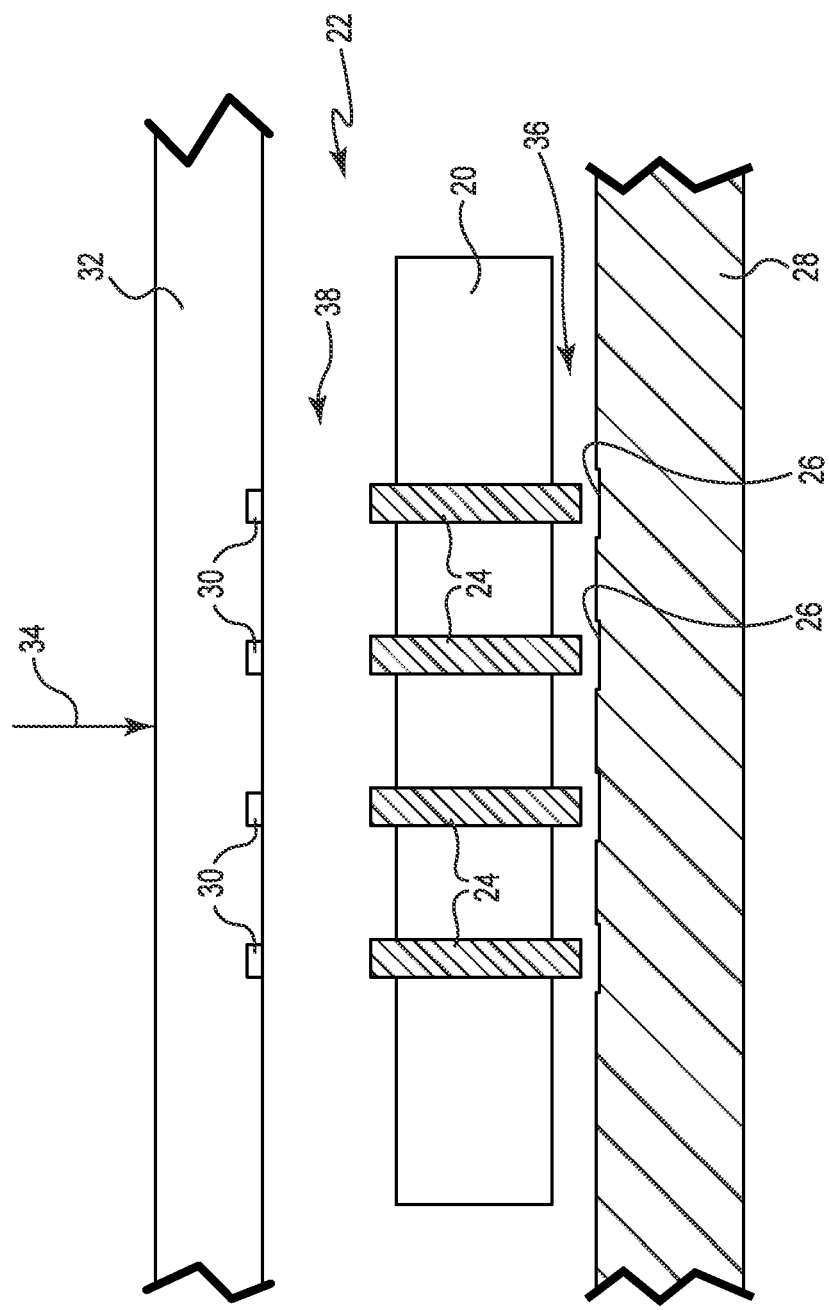
FIG. 1 is a cross-sectional view of a prior art wafer probe used to test IC devices.
Figure 2:
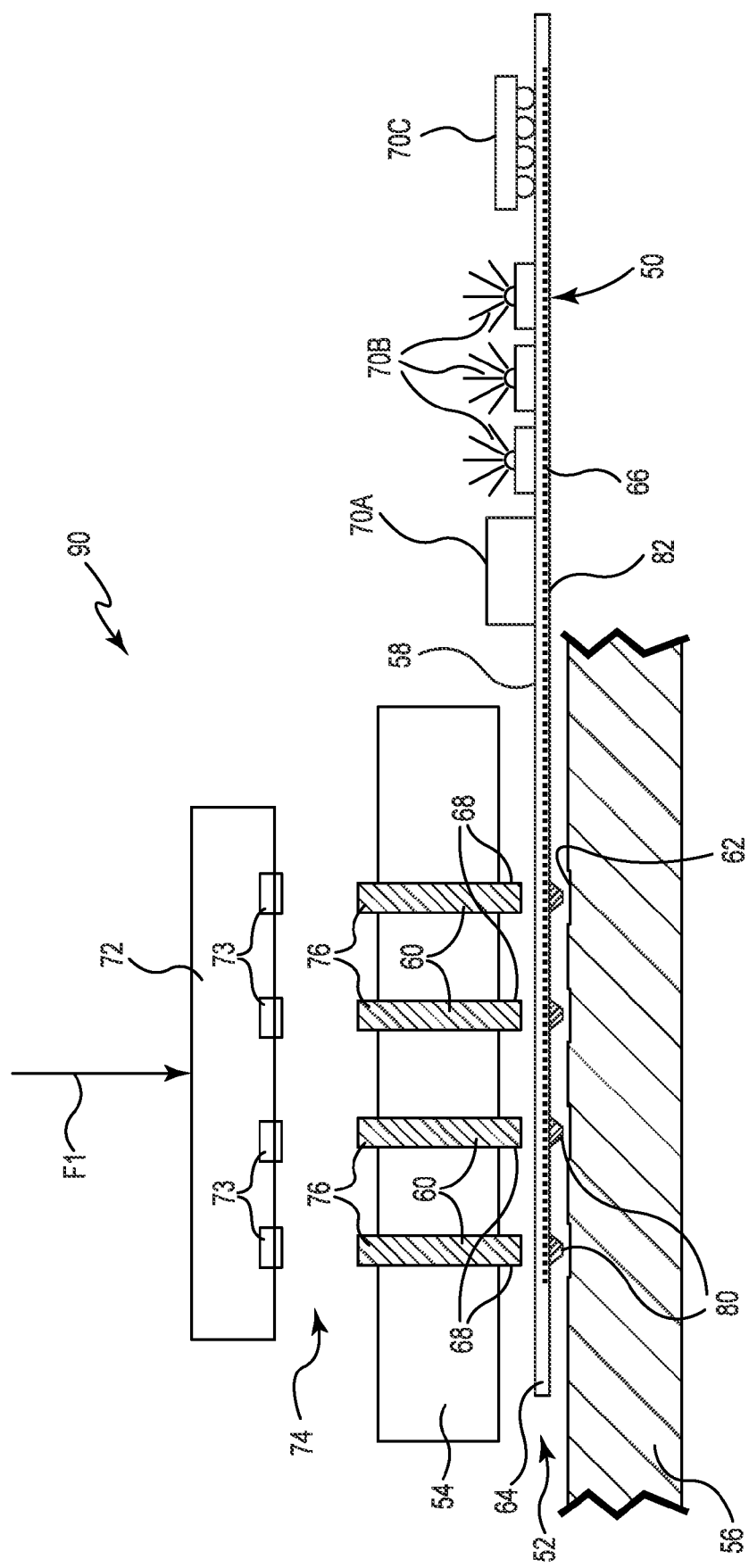
FIG. 2 is a schematic illustration of a test system with a diagnostic tool electrically coupling a wafer-level IC device to a testing system in accordance with an embodiment of the present disclosure.

FIG. 2 is a schematic illustration of diagnostic tool 50 electrically coupled at an interface 52 of a wafer probe 54 and a wafer-level IC device 56 in accordance with an embodiment of the present disclosure. A compliant printed circuit 58 of the diagnostic tool 50 is positioned to function as an electrical interconnect between probe members 60 on the wafer probe 54 and contact pads 62 on the wafer-level IC device 56.

The wafer probe 54 permits testing an interface 74 between an IC testing device 72 and proximal ends 76 of the probe members 60 of the wafer probe 54. And the IC testing device 72 can be engaged or disengaged with the probe members 60 of the wafer probe 54 without reflowing solder. In the illustrated embodiment, the IC testing device 72 is a printed circuit board, either including, or connected to, testing electronics. In another embodiment, the IC testing device 72 can be one or more dedicated integrated circuits programmed to perform testing functions.

The compliant printed circuit 58 can operate with fine contact-to-contact spacing (or "pitch") on the order of less than 1.0 millimeter pitch, and more preferably a pitch of less than about 0.7 millimeter, and most preferably a pitch of less than about 0.4 millimeter. The compliant printed circuit 58 can be a flexible polymeric sheet 64 having a plurality of conductive traces 66 arranged in an array to electrically couple with distal ends 68 of probe members 60 and contact pads 62 on the wafer-level IC device 56. Force F1 is preferably applied to the wafer probe 54 to compressively couple distal ends 68 with the contact pads 62 through the compliant printed circuit 58. The traces 66 electrically couple the probe members 60 and contact pads 62 with electrical devices 70A, 70B, 70C (collectively "70") positioned at distal end of the diagnostic tool 50 away from the first interface. The electrical devices 70 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

In the configuration of FIG. 2, the diagnostic tool 50 can evaluate the operation of the wafer-level IC device 56, the interface 52 of the wafer probe 54 and the wafer-level IC device 56, the wafer probe 54, the interface 74 between IC testing device 72 and the proximal ends 76 of probe members 60, and/or the IC testing device 72. For example, LCD 70A can display a pin-map of the probe members 60, LED's 70B can indicate open/short, and integrated circuit 70C can provide specific diagnostic functionality to make the diagnostic tool 50 more than a basic open or short testing tool. In one embodiment, the IC testing device 72 is a dedicated electrical device designed to validate operation of the test system 90. Once operation of the test system 90 is verified, the wafer probe 54 is ready to test production IC devices. The production IC devices are positioned in the test system in place of the IC testing device 72.

The flexible polymeric sheet 64 optionally includes contact members 80 arranged in an array along a surface 82 of the compliant printed circuit 58 that correspond with the contact pads 62 on the wafer-level IC device 56. The contact members 80 can optionally have a pitch that is different than pitch of the distal ends 68 of the probe members 60. In an alternate embodiment, a variety of other circuit members can be substituted for the wafer-level IC device 56, such as for example another flexible circuit, a packaged or unpackaged bare die silicon device, an integrated circuit device, an organic or inorganic substrate, or a rigid circuit.

The flexible polymeric sheet 64 is optionally singulated around the contact members 80. Singulation is a complete or partial separation of the terminal 80 from the sheet 64 that does not disrupt the electrical integrity of the conductive trace 66. The singulation can be a slit surrounding a portion of the contact member 80. The slit can be located adjacent to the perimeter of the contact member 80 or offset therefrom. Singulation of the compliant printed circuit 58 can control the amount of force transferred to the wafer-level IC device 56, and the range of motion singulation of the CPC 58 also assist with creating a more evenly distributed force vs. deflection profile across the array.

The singulations can be formed at the time of manufacture of the polymeric sheet 64 or can be subsequently patterned by mechanical methods such as stamping or cutting, chemical methods such as photolithography, electrical methods such as excess current to break a connection, a laser, or a variety of other techniques. In one embodiment, a laser system, such as an Excimer laser, a $CO_2$ laser, or a YAG laser, creates the singulation. A singulated structure is advantageous in several ways, because the force of movement is greatly reduced where the compliant printed circuit 58 is no longer a continuous membrane, but a series of flaps or bond sites with a living hinge and bonded contact.

The IC testing device 72 has a plurality of contact pads 73. Force F1 preferably compressively couples the contact pads 73 with the proximal ends 76 of the probe members 60. The force F1 can be provided by a variety of mechanisms, such as disclosed in U.S. Pat. No. 7,101,210 (Lin et al.); U.S. Pat. No. 6,971,902 (Taylor et al.); U.S. Pat. No. 6,758,691 (McHugh et al.); U.S. Pat. No. 6,461,183 (Ohkita et al.); and U.S. Pat. No. 5,161,983 (Ohno et al.), which are hereby incorporated by reference. The proximal ends 76 of the probe members 60 can be configured to electrically couple with a variety of types of contact pads 73 on the IC testing device 72.

The compliant printed circuit 58 and the electrical devices 70 are preferably manufactured using printing technology, such as for example, inkjet printing, screen printing, printing through a stencil, flexo-gravure printing, and offset printing, rather than traditional PCB fabrication techniques. Various methods of printing the compliant printed circuit and the electrical devices are disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are incorporated herein by reference. For example, conductive inks containing metal particles are printed onto the compliant printed circuit 58 and subsequently sintered.

A printing process can preferably be used to fabricate various functional structures, such as conductive paths and electrical devices without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Recesses may be formed in layers of the compliant printed circuit 58 to permit control of the location, cross section, material content, and aspect ratio of the contact members 80 and the conductive traces 66 in the compliant printed circuit 66. Maintaining the conductive traces with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using the recesses to control the aspect ratio of the conductive traces 66 results in a more rectangular or square cross-section of the conductive traces, with the corresponding improvement in signal integrity.

U.S. Pat. No. 6,506,438 (Duthaler et al.) and U.S. Pat. No. 6,750,473 (Amundson et al.), which are incorporated herein by reference, teach using inkjet printing to make various electrical devices, such as resistors, capacitors, diodes, inductors (or elements which can be used in radio applications or magnetic or electric field transmission of power or data), semiconductor logic elements, electro-optical elements, transistors (including, light emitting, light sensing or solar cell elements, field effect transistors, top gate structures), and the like.

U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference, teach using aerosol printing to create various electrical devices and features.

Printing of electronically active inks can be done on a large class of substrates, without the requirements of standard vacuum processing or etching. The inks may incorporate mechanical, electrical or other properties, such as, conducting, insulating, resistive, magnetic, semiconductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from Dupont located in Wilminton, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181 (Bridenbaugh et al.), which is incorporated herein by reference.

A protective layer can optionally be printed onto the electrical devices and features. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present invention.

An inkjet print head, or other print head, preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electropneumatic, electrostatic, rapid ink heating, magnetohydrodynamic, or any other technique well known to those skilled in the art. The deposited ink patterns typically undergo a curing step or another processing step before subsequent layers are applied.

While inkjet printing is preferred, the term "printing" is intended to include all forms of printing and coating, including: premetered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; aerosol printing processes; and other similar techniques.

The additive nature of inkjet printing of electrical devices and features provides an excellent means to print the desired functions directly on the compliant printed circuit 58, rather than mounting the electrical devices discretely. For example, the electrical devices 70 can be a capacitor, a resistor, a battery, a filter, a signal or power altering and enhancing device, a memory device, an embedded integrated circuit, and a RF antenna. The electrical devices 70 can be printed on either surface of the polymeric sheet 64. Inkjet printing can also be used to form additional layers on the flexible polymeric sheet 64, such as for example dielectric layers covering the conductive traces 66, power planes, ground planes, and the like.

Positioning such electrical devices 70 on the compliant printed circuit 58 in close proximity to the IC testing device 72 can improve performance of the diagnostic tool 50. The present diagnostic tool 50 can permit integrated circuit manufacturers to reduce the pitch of the probe members 60 on the wafer-level IC device 56, and perform any required signal routing in the compliant printed circuit 58, rather than in the IC testing device 72 or by adding daughter boards to the system. IC manufacturers also are limited by the wafer probe 54, and the configuration of the probe members 60 therein, when designing the configuration of contact pads 62 on the wafer-level IC device 56. Performing routing (of a connection between the probe members 60 and contact pads 62) in the compliant printed circuit 58 can permit quick and inexpensive changes.

In another embodiment, the conductive traces 66 of the compliant printed circuit 50 are formed by transferring pre-patterned or pre-etched thin conductive foil circuit traces to recesses in a layer of the compliant printed circuit 50. For example, a pressure sensitive adhesive can be used to retain the copper foil circuit traces in the recesses. The trapezoidal cross-sections of the pre-formed conductive foil traces are then post-plated. The plating material fills the open spaces in the recesses not occupied by the foil circuit geometry, resulting in a substantially rectangular or square cross-sectional shape corresponding to the shape of the recesses.

In another embodiment, a thin conductive foil is pressed into the recesses, and the edges of the recesses act to cut or shear the conductive foil. The process positions a portion of the conductive foil in the recesses, but leaves the negative pattern of the conductive foil not wanted outside and above the recesses for easy removal. Again, the foil in the recesses is preferably post plated to add material to increase the thickness of the conductive traces and to fill any voids left between the conductive foil and the recesses.

Figure 3:
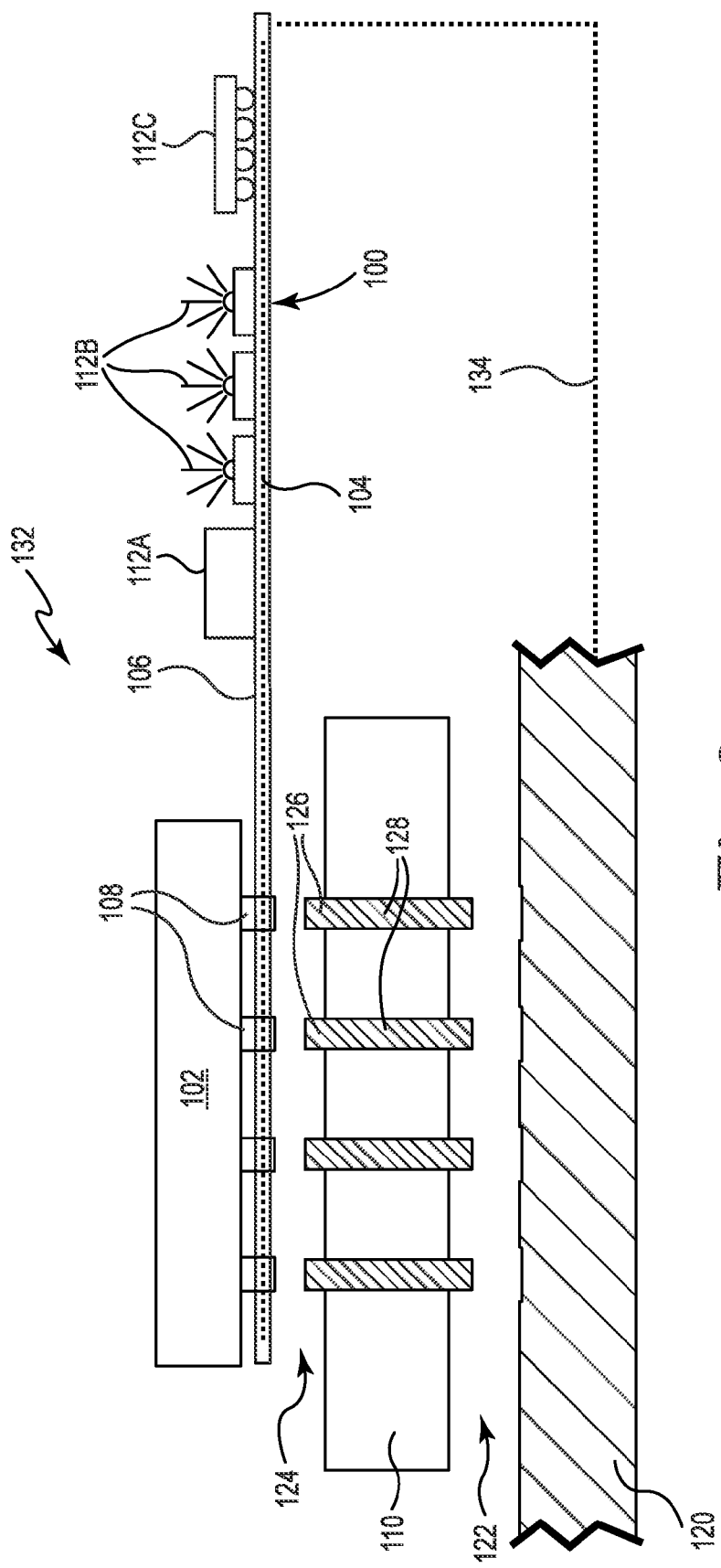
FIG. 3 is a schematic illustration of test system with an alternate diagnostic tool mated with a dedicated IC testing device in accordance with an embodiment of the present disclosure.

FIG. 3 is a schematic illustration of an alternate diagnostic tool 100 mated with IC testing device 102, according to one embodiment of the present disclosure. The IC testing device 102 is preferably a dedicated IC adapted to test a wafer-level IC device 120. Conductive traces 104 on the compliant printed circuit 106 are electrically coupled with contact pads 108 on the IC testing device 102, either by soldering on in a solderless manner. The illustrated IC testing device 102 is a land grid array (LGA) device, but any other IC package configuration can be used with the diagnostic tool 100 of FIG. 3.

The compliant printed circuit 106 can be configured to simulate the system in which the wafer-level IC device 120 will be used, with desired functions, such as for example open/close shorting, daisy chain, or a diagnostic IC built into the electrical devices 112A, 112B, 112C (collectively "112") of the diagnostic tool 100. An electrical connection 134 can be optionally provided between the diagnostic tool 100 and the wafer-level IC device 120.

In the configuration of FIG. 3, a test system 132 can evaluate the operation of the wafer-level IC device 120, an interface 122 of a wafer probe 110 and the wafer-level IC device 120, the wafer probe 110, and the interface 124 between IC testing device 102 and the proximal ends 126 of probe members 128. Again, the compliant printed circuit 106 and the electrical devices 112 are preferably manufactured using inkjet printing technology, aerosol printing technology, or other maskless deposition techniques, as previously described, rather than traditional PCB fabrication techniques.

Figure 4:
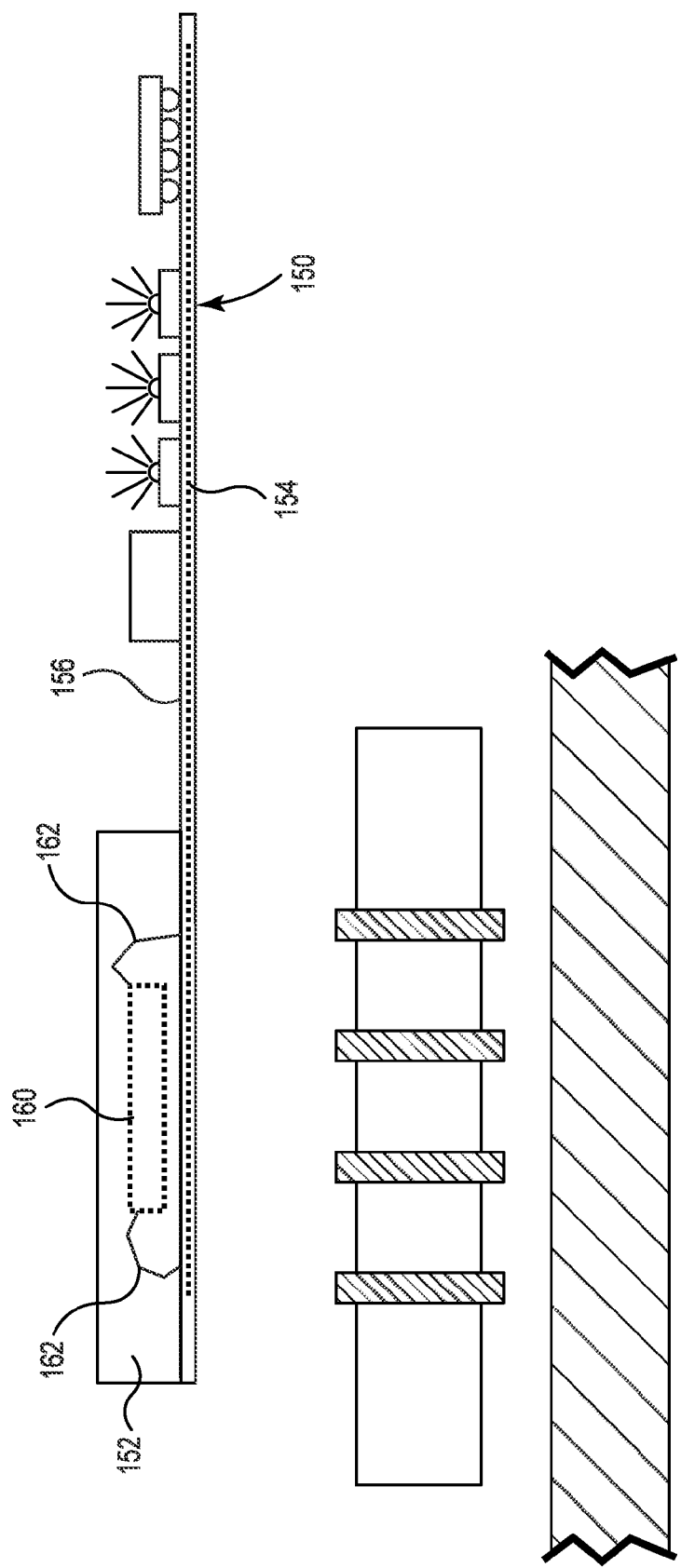
FIG. 4 is a schematic illustration of a test system with an alternate diagnostic tool merged with a dedicated IC testing device in accordance with an embodiment of the present disclosure.

FIG. 4 is a schematic illustration of an alternate diagnostic tool 150 substantially as shown in FIG. 3 with a compliant printed circuit 156 merged with an IC package 152 in accordance with an embodiment of the present disclosure. The conductive traces 154 on the compliant printed circuit 156 can be electrically coupled with an IC testing device 160, such as for example by wire bonding 162. The compliant printed circuit 156 is preferably attached or bonded to the IC package 152. As used herein, "bond" or "bonding" refers to, for example, adhesive bonding, solvent bonding, ultrasonic welding, thermal bonding, or any other techniques suitable for attaching adjacent layers.

Figure 5:
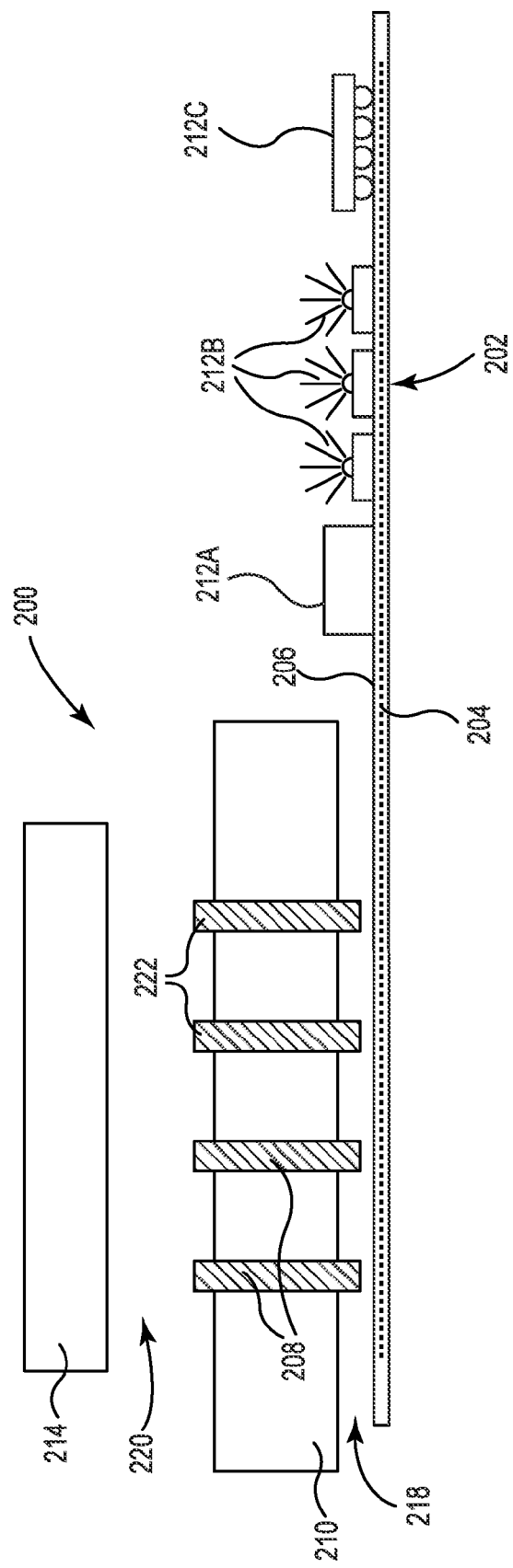
FIG. 5 is a schematic illustration of a test system with a diagnostic tool substituted for the wafer-level IC device in accordance with an embodiment of the present disclosure.

FIG. 5 is a schematic illustration of a diagnostic (test) system 200 with a diagnostic tool 202 substituted for the wafer in accordance with an embodiment of the present disclosure. Conductive traces 204 on a compliant printed circuit 206 electrically couple probe members 208 on a wafer probe 210 with electrical devices 212A, 212B, 212C (collectively "212"). The electrical devices 212 are also on the CPC 206, positioned away from an interface 218 of the wafer probe 210 and the CPC 206.

An IC testing device 214 couples with the wafer probe 210 as discussed above with reference to FIG. 2. In the configuration of FIG. 5, the diagnostic tool 202 can evaluate an interface 218 of the wafer probe 210 and the CPC 206, the wafer probe 210, an interface 220 between IC testing device 214 and proximal ends 222 of probe members 208 of the wafer probe 210, and/or the IC testing device 214. Again, the compliant printed circuit 206 and the electrical devices 212 are preferably manufactured using Inkjet printing technology as previously described, rather than traditional PCB fabrication techniques.

Figure 6:
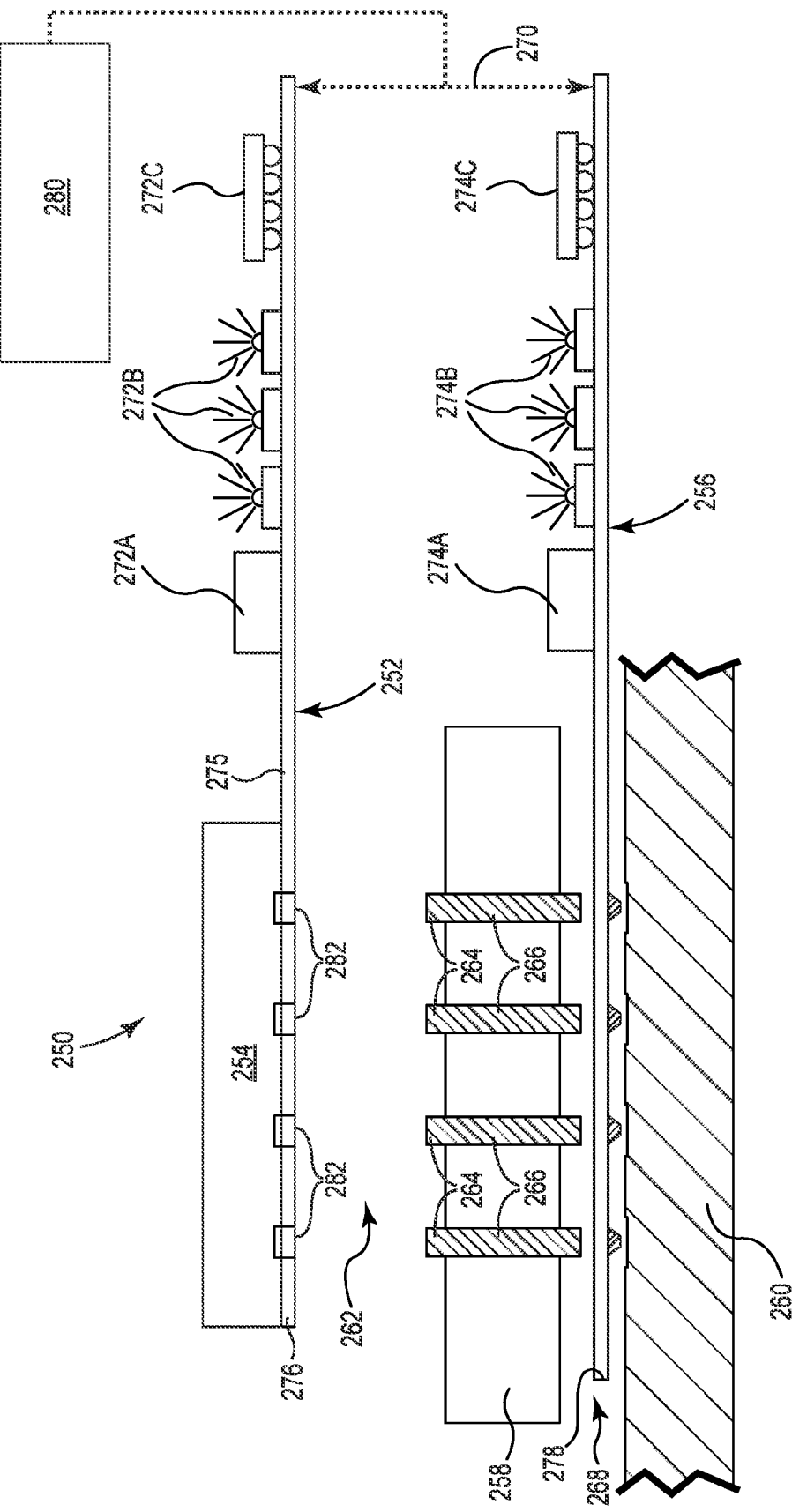
FIG. 6 is a schematic illustration of a test system with first and second diagnostic tools in accordance with an embodiment of the present disclosure.

FIG. 6 is a schematic illustration of a diagnostic (test) system 250 with a first diagnostic tool 256 and a second diagnostic tool 252 in accordance with an embodiment of the present disclosure. The second diagnostic tool 252 can be merged with a dedicated IC testing device 254 and used in conjunction with the first diagnostic tool 256. The first diagnostic tool 256 functions as an interconnect a between wafer probe 258 and a wafer-level IC device 260. The second diagnostic tool 252 may comprise a compliant printed circuit 275 positioned to function as an electrical interconnect with proximal ends 264 of probe member 266. The compliant printed circuit 275 can be a flexible polymeric sheet 276 having a plurality of contact pads 282 constructed and arranged to form an electrical interconnect with proximal ends 264 of probe members 266 in the wafer probe 258 at a second interface 262.

In the diagnostic system of FIG. 6, the second diagnostic tool 252 can evaluate the interface 262 between the dedicated IC testing device 254 and the proximal ends 264 of the probe members 266 in the wafer probe 258, while the first diagnostic tool 256 can evaluate the wafer probe 258, an interface 268 of a wafer-level IC device 260 and the wafer probe 258, and the wafer-level IC device 260. An electrical connection 270 can permit electrical devices 272A, 272B, 272C (collectively "272") on the second diagnostic tool 252 to interact with electrical devices 274A, 274B, 274C (collectively "274") on the first diagnostic tool 256 to provide additional functionality and cross-checking of the various diagnostic tests.

The electrical devices 272, 274 can be a variety of passive and active devices, such as for example, a power plane, a ground plane, a capacitor, a resistor, a battery, a filter, a signal or power altering and enhancing device, a memory device, an embedded integrated circuit, or a RF antennae. The electrical devices 272, 274 can be printed on either surface of the polymeric sheets 276, 278 using a printing technology as previously described. The test system 250 of FIG. 6 can eliminate the need for a separate test station 280 or can supplement the functionality of the test station 280.

Figure 7:
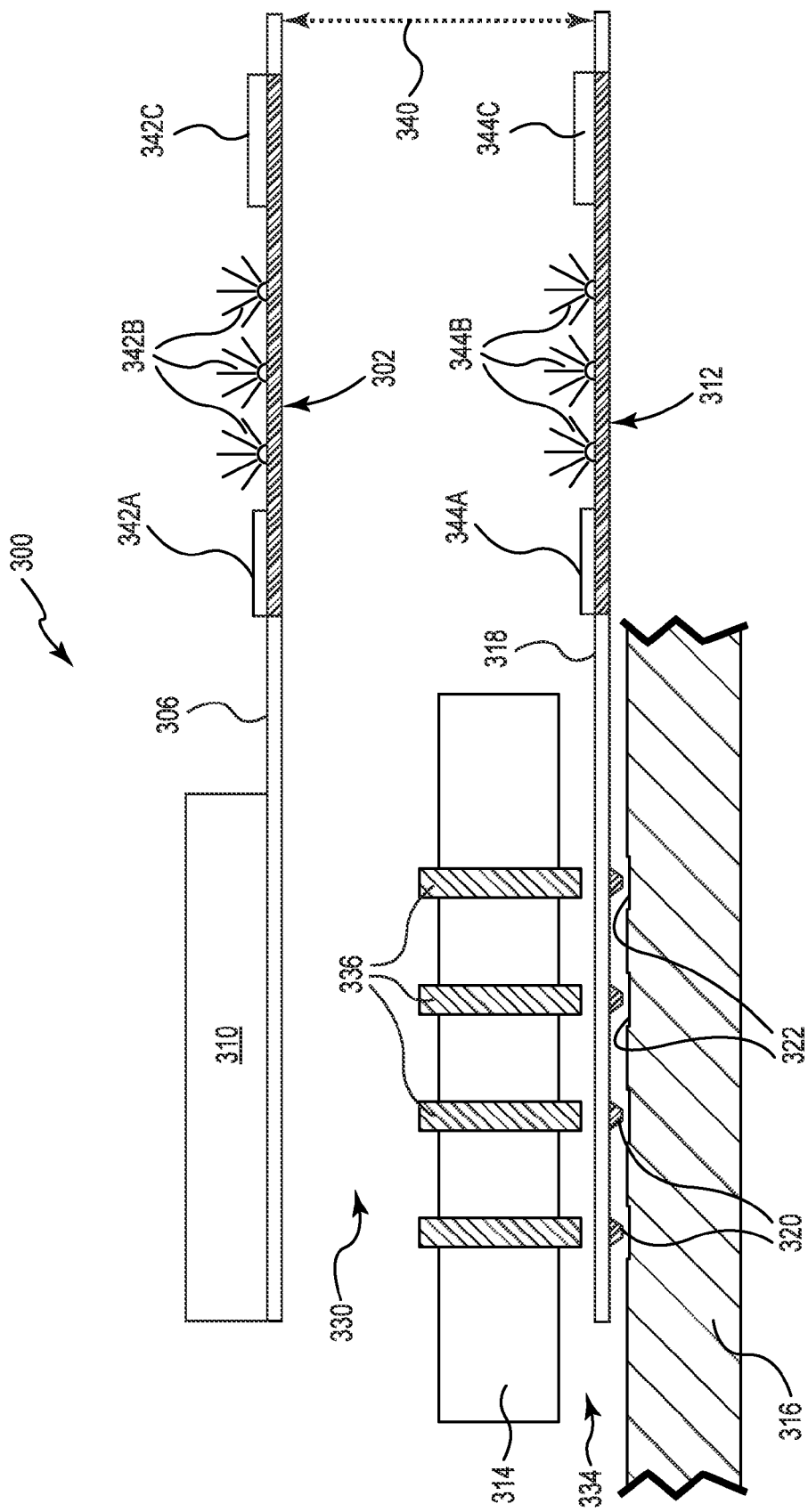
FIG. 7 is a schematic illustration of a test system with first and second diagnostic tools adapted to engage with land grid array (LGA) devices in accordance with an embodiment of the present disclosure.

FIG. 7 is a schematic illustration of a diagnostic (test) system 300 including a first diagnostic tool 312 and a second diagnostic tool 302. The second diagnostic tool 302 can have a dedicated IC testing device 310 merged with a compliant printed circuit 306. The first diagnostic tool 312 can function as an interconnect between a wafer probe 314 and wafer-level IC device 316. A compliant printed circuit 318 of the first diagnostic tool 312 can include printed contact members 320 configured to electrically couple with contact pads 322 on the wafer-level IC device 316.

In the configuration of FIG. 7, the second diagnostic tool 302 can evaluate the interface 330 of the IC testing device 310 and the wafer probe 314 and test the functionality of the wafer-level IC device 316. The first diagnostic tool 312 can evaluate the interface 334 between probe members 336 in the wafer probe 314 and the wafer-level IC device 316 and can also test the functionality of the wafer-level IC device 316. An electrical connection 340 can permit the electrical devices 342A, 342B, 342C (collectively "342") on the second diagnostic tool 302 to interact with electrical devices 344A, 344B, 344C (collectively "344") on the first diagnostic tool 312 to provide additional functionality and cross-checking of the various diagnostic tests.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the invention. The upper and lower limits of these smaller ranges which may independently be included in the smaller ranges is also encompassed within the embodiments of the invention, subject to any specifically excluded limit in the stated range. Where the stated range includes one or both of the limits, ranges excluding either both of those included limits are also included in the embodiments of the invention.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the embodiments of the present invention are not entitled to antedate such publication by virtue of prior invention. Further, the dates of publication provided may be different from the actual publication dates which may need to be independently confirmed.

Other embodiments of the invention are possible. Although the description above contains much specificity, these should not be construed as limiting the scope of the invention, but as merely providing illustrations of some of the presently preferred embodiments of this invention. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the invention. Thus, it is intended that the scope of at least some of the present invention herein disclosed should not be limited by the particular disclosed embodiments described above.

Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

What is claimed is:

1. A diagnostic tool for testing a wafer-level integrated circuit (IC) device coupled to testing electronics, the diagnostic tool comprising:
    a first diagnostic tool adapted to be located at a first interface between a wafer probe and the wafer-level IC device, the first diagnostic tool comprising;
        a first compliant printed circuit comprising a flexible polymeric sheet with a plurality of contact pads contacting distal ends of probe members in the wafer probe at a first interface and raised probe members located on the compliant printed circuit in an array contacting a plurality of contact pads on the wafer-level IC device at the first interface;
        a plurality of conductive traces printed on the first compliant printed circuit and electrically coupling to the plurality of contact pads; and
        a plurality of electrical devices printed on the first compliant printed circuit at a position external to the first interface, the electrical devices coupled to the conductive traces and configured to provide one or more of continuity testing at the first interface or functionality testing of the wafer-level IC device.

2. The diagnostic tool of claim 1, wherein the conductive traces comprise substantially rectangular cross-sectional shapes.

3. The diagnostic tool of claim 1, wherein a conductive material, a non-conductive material, and a semi-conductive material are printed on a single layer of the compliant printed circuit.

4. The diagnostic tool of claim 1, further comprising raised probe members printed on the compliant printed circuit in an array configured to electrically couple with the plurality of contact pads on the wafer-level IC device.

5. The diagnostic tool of claim 1, wherein the electrical devices comprise at least one of a capacitor, a resistor, a filter, a signal or power altering and enhancing device, a capacitive coupling feature, a memory device, an embedded integrated circuit, and a RF antennae.

6. The diagnostic tool of claim 1, wherein the first compliant printed circuit comprises one or more printed layers comprising one or more of a dielectric layer, a ground plane, or a power plane.

7. The diagnostic tool of claim 1, further comprising a second diagnostic tool coupled to an IC testing device and including a plurality of contact pads configured to form an electrical interconnect with proximal ends of the probe members in the wafer probe at a second interface.

8. The diagnostic tool of claim 7, wherein the IC testing device is programmed to provide one or more of continuity testing at the second interface, testing the first diagnostic tool, or testing the wafer-level IC device.

9. The diagnostic tool of claim 1, further comprising:
    a second diagnostic tool comprising;
        a dedicated IC testing device including a plurality of contact pads configured to form an electrical interconnect with proximal ends of the probe members in the wafer probe at a second interface;
        a second compliant printed circuit electrically coupled to the dedicated IC device;
        a plurality of printed conductive traces coupled to the plurality of contact pads on the dedicated IC testing device; and
        a plurality of electrical devices printed on the second compliant printed circuit at a position external to the second interface, the electrical devices electrically coupled to the conductive traces on the second compliant printed circuit and configured to provide one or more of continuity testing at the second interface, functionality testing of the first diagnostic tool, or functionality testing of the wafer-level IC device.

10. The diagnostic tool of claim 9, further comprising an electrical connection between the first diagnostic tool and the second diagnostic tool.

11. A diagnostic system for testing a wafer-level IC device coupled to testing electronics, the diagnostic system comprising:
    a first diagnostic tool comprising;
        a dedicated IC testing device including a plurality of contact pads;
        a first compliant printed circuit comprising a flexible polymeric sheet located at a first interface between the dedicated IC testing device and a wafer probe, the first compliant printed circuit comprising a plurality of contact pads electrically coupled to the contact pads on the dedicated IC testing device and contact pads contacting proximal ends of probe members in the wafer probe;
        a plurality of printed conductive traces electrically coupled to the plurality of the contact pads of the first compliant printed circuit; and
        a plurality of electrical devices printed on the first compliant printed circuit at a position away from the first interface, the electrical devices electrically coupled to the conductive traces and configured to provide one or more of continuity testing at the first interface, continuity testing at a second interface between distal ends of the probe members in the wafer probe and the wafer-level IC device, or functionality testing of the wafer-level IC device.

12. The diagnostic system of claim 11, wherein the electrical devices comprise at least one of a capacitor, a resistor, a filter, a signal or power altering and enhancing device, a capacitive coupling feature, a memory device, an embedded integrated circuit, and a RF antennae.

13. The diagnostic system of claim 11, wherein the first compliant printed circuit comprises one or more printed layers comprising one or more of a dielectric layer, a ground plane, or a power plane.

14. The diagnostic system of claim 11, further comprising: a second diagnostic tool comprising;
    a second compliant printed circuit comprising a plurality of contact pads configured to form an electrical interconnect with distal ends of probe members in the wafer probe and contact pads on the wafer-level IC device at a second interface;
    a plurality of printed conductive traces electrically coupled to the plurality of the contact pads on the second compliant printed circuit; and
    a plurality of electrical devices printed on the second compliant printed circuit at a position away from the second interface, the electrical devices electrically coupled to the conductive traces on the second compliant printed circuit and adapted to provide one or more of continuity testing at the second interface or functionality testing of the wafer-level IC device.

15. The diagnostic system of claim 14, further comprising an electrical connection between the first diagnostic tool and the second diagnostic tool.

16. A method of making a first diagnostic tool for testing a wafer-level IC device coupled to testing electronics by a wafer probe, the method comprising the steps of:
    printing a plurality of contact pads on a first compliant printed circuit comprising a flexible polymeric sheet, the contact pads contacting distal ends of probe members in the wafer probe and-raised probe members located on the compliant printed circuit in an array contacting a plurality of contact pads on the wafer-level IC device at a first interface;
    printing a plurality of conductive traces electrically coupled to the plurality of contact pads on the first compliant printed circuit;
    printing a plurality of electrical devices on the first compliant printed circuit at a location external to the first interface and in a manner such that the electrical devices are electrically coupled to the conductive traces;
    positioning the first compliant printed circuit between the wafer probe and the wafer-level IC device to form an electrical interconnect at the first interface; and
    evaluating one or more of continuity at the first interface or functionality of one or more wafer-level IC devices.

17. The method of claim 16, wherein the conductive traces comprise substantially rectangular cross-sectional shapes.

18. The method of claim 16, further comprising printing a conductive material, a non-conductive material, and a semi-conductive material on a single layer of the compliant printed circuit.

19. The method of claim 16, further comprising printing one or more of a capacitor, a resistor, a filter, a signal or power altering and enhancing device, a capacitive coupling feature, a memory device, an embedded integrated circuit, and a RF antennae on the first compliant printed circuit.

20. The method of claim 16, further comprising printing one or more of a dielectric layer, a ground plane, or a power plane on the first compliant printed circuit.

21. The method of claim 16, further comprising a method of making a second diagnostic tool, the method comprising the steps of:
    forming an electrical interconnect with proximal ends of the probe members and contact pads on a dedicated IC testing device at a second interface;
    electrically coupling the dedicated IC testing device with a second compliant printed circuit;
    printing a plurality of conductive traces to be electrically coupled to the dedicated IC device;
    printing a plurality of electrical devices on the second compliant printed circuit at a position away from the second interface and such that the electrical devices are electrically coupled to the conductive traces on the second compliant printed circuit; and
    evaluating one or more of continuity at the second interface, functionality of the first diagnostic tool, or functionality of the wafer-level IC device.

* * * * *